United States Patent [19]
Barber

[11] Patent Number: 6,150,818
[45] Date of Patent: Nov. 21, 2000

[54] LOW EDDY CURRENT AND LOW HYSTERESIS MAGNET POLE FACES IN MR IMAGING

[75] Inventor: William Daniel Barber, Ballston Lake, N.Y.

[73] Assignee: General Electric Company, Schenectady, N.Y.

[21] Appl. No.: 09/143,960

[22] Filed: Aug. 31, 1998

[51] Int. Cl.$^7$ ................................................. G01V 3/00
[52] U.S. Cl. .......................................... 324/319; 324/320
[58] Field of Search .................................. 324/319, 320, 324/318, 300, 307, 309; 335/229, 301, 304

[56] References Cited

U.S. PATENT DOCUMENTS

| | | |
|---|---|---|
| 2,951,247 | 8/1960 | Halpern et al. . |
| 4,675,609 | 6/1987 | Danby et al. . |
| 4,827,235 | 5/1989 | Inomata et al. . |
| 5,061,897 | 10/1991 | Danby et al. . |
| 5,252,924 | 10/1993 | Sakurai et al. ........................... 324/320 |
| 5,283,544 | 2/1994 | Sakurai et al. . |
| 5,555,251 | 9/1996 | Kinanen ................................. 324/319 |
| 5,592,089 | 1/1997 | Danby et al. ............................ 324/318 |

OTHER PUBLICATIONS

Bloch, F.W., W. Hansen and M. Packard, "The Nuclear Introduction Experiment", Phy. Rev. 70, 474–485, 1946.

West, D.H., "Computer–assisted Magnet Shimming", Rev. Sci. Instruments, 52(12), 1910–1912, 1981.

Yamashita, H., N. Ono, Y. Hashimoto, K. Ishino, M. Inoue, and K. Akita, "Electromagnetic Absorbing Wall for TV Ghost Suppression", Trans. IECE, Japan, E61(8), 657, 1978.

Rytov, S.M., "The Electromagnetic Properties of a Finely Layered Medium", J. Exptl. Theoret. Phys., USSR, 29, 605–616, 1955 (pp. 466–475).

"Gradient Coil Design Considerations for Iron Core Interventional Magnets", A. Ersahin, M.J. Bronskill, R.M. Henkelman, B. Collick, R.S. HinksThe Scott Hinks Publication (attached) Abstract submitted, but not yet published, pp. 1–21, Figs. 1A–10 (1996–1997).

Experimental Use—Abstract Sheet "Low Eddy Current and Low Hysteresis Magnet Pole Faces in MR Imaging" by W. Barber.

Proceedings of the International Society for Magnetic Resonance In Medicine—Fifth Scientific Meeting and Exhibition, Apr. 12–18, 1997, vol. 1, p. 1466.

Proceedings of the International Society for Magnetic Resonance in Medicine—Fourth Scientific Meeting and Exhibition, Apr. 27–May 3, 1996, vol.. 3, p. 124.

*Primary Examiner*—Louis Arana
*Attorney, Agent, or Firm*—Jean K. Testa; Donald S. Ingraham

[57] ABSTRACT

Pole faces for an open magnetic resonance (MR) imaging system are constructed from a number of blocks having laminate sheets. The laminate sheets of the blocks are aligned, such that they are parallel to the flux of an applied time-changing magnetic field. Each laminate sheet is constructed of an amorphous material such that there is no predominant magnetic field alignment. This construction reduces eddy currents induced in the pole faces, and reduces residual magnetization, thereby reducing artifacts in an acquired image.

18 Claims, 4 Drawing Sheets

LOW EDDY CURRENT AND LOW HYSTERESIS MAGNET POLE FACES IN MR IMAGING

BACKGROUND OF THE INVENTION

1. Field of the Invention

This invention relates to Magnetic Resonance (MR) imaging, and more specifically, pole faces of open magnets used in MR imaging.

2. Description of Related Art

Typically in magnetic resonance (MR) imaging, a patient is inserted into a 'closed' cylindrical shaped magnet. This arrangement does not allow the Physician access to the patient to perform procedures interactively during imaging.

'Open' magnets have been employed to allow access to the patient during imaging. These however, suffer from the problems of creating a strong, uniform, homogeneous magnetic field over an imaging volume, especially when time-changing magnetic field gradients are applied.

When ferromagnetic materials are used, the surface of the open magnet emanating the magnetic field is called a pole face. It receives magnetic flux from a magnetic source attached to it. The magnetic sources may, or may not be connected with a low reluctance (high magnetic permeability) ferromagnetic flux closure, completing a "C" shaped flux path.

Problems arise when a rapidly time-changing magnetic field is applied to the pole faces. Since the pole faces are constructed of electrically conducting materials, eddy currents are created, which in turn, create magnetic fields that oppose the applied magnetic field.

Application of the time-changing magnetic field also causes a secondary, residual, magnetic field to be created in the pole face material, which remains after an applied magnetic field is removed. This is described by the hysteresis of the material.

Both eddy currents, and the residual magnetization distort the magnetic field, and therefore, the image created from that magnetic field.

U.S. Pat. No. 5,283,544 Sakurai et al., Feb. 1, 1994 explains a device aimed at reducing eddy currents in an open MR imaging device by minimizing the path of the eddy current. This device employs pole faces constructed from blocks. The eddy currents would not flow around the entire pole face, but just in each block individually.

Sakurai also constructed each block of laminate sheets aligned parallel to the induced time-changing magnetic field. This allowed greater permeability of the magnetic flux in a direction parallel to the laminate sheets.

Sakurai's construction did reduce eddy currents and residual magnetization, however, these effects may be further reduced, and further improve imaging.

Currently, there is a need to further reduce induced eddy current and residual magnetization in open MR imaging machines to reduce artifacts in images created.

SUMMARY OF THE INVENTION

An open magnetic resonance (MR) imaging system which exhibits reduced artifacts due to the reduction in eddy currents and residual magnetization. It is comprised of ferromagnetic pole pieces each having a pole face which bound an imaging volume. These faces are substantially parallel to each other. Since rapidly time-changing magnetic fields are applied by gradient coils to alter the applied static magnetic field, there are eddy currents which are induced in the conducting material of the pole pieces. Also since the material used exhibits residual magnetization, the magnetic flux does not follow exactly the applied gradient field. To correct these problems, the pole pieces are constructed of a plurality of blocks which are comprised of laminate sheets. Each of these sheets is separated by and held together with a non-conductive substrate. The sheets are aligned substantially parallel to the pole faces such that the majority of the magnetic flux which flows parallel to the pole face will be least impeded by eddy currents in the conductive material. This part of the applied magnetic field gradient will produce eddy currents which circle through the thickness of each of the laminate sheets. Due to the smaller path of the eddy currents, the time constants for their dissipation are greatly reduced and therefore the eddy currents dissipate much more rapidly than do a pole piece which does not use laminate sheets.

That part of the applied magnetic field gradient perpendicular to the sheet will produce eddy currents which circle around the perimeter of each of the laminate sheets. The eddy current the time constants for their dissipation are determined by the dimensions of the surface of the block, smaller blocks permit the eddy currents to dissipate much more rapidly than do a pole piece constructed of continuous sheets.

The actual size and separation of these blocks in a given direction also effects the degree of magnetic flux through the pole piece in that direction. A greater separation between adjacent blocks causes reduced magnetic flux parallel to the layers.

Also a plurality of layers of blocks may be employed. The spacing between layers is also important in effecting the magnetic flux through the pole pieces. The larger the spacing between layers less the magnetic flux perpendicular to the layers.

By partially overlapping the blocks in adjacent layers the relative amount of magnetic flux perpendicular and parallel to the layers. This is a method of optimizing performance between the magnetic source and the magnetic field gradients.

Since many materials have a polycrystalline structure which impedes a change in residual magnetization, it was determined to use amorphous materials which have very little or no overall crystallite structure. Materials such as Fe—B (example $Fe_{80}B_{20}$), Fe—B—Si, Fe—B—Si—C, Fe—Ni—B may be used along with other known amorphous ferromagnetic materials as the laminate sheets of each of the blocks of the pole pieces.

There generally is an underlying ferromagnetic support structure, pole pieces, beneath the laminate sheet region. This region will also have a coercive field usually greater than that of the laminations. If the time-varying field of the gradient is sufficiently strong to penetrate through the lamination layer (pole face), then the residual magnetization state of this pole piece can change. This residual magnetization, in turn, will lead to a bias magnetic field and result in an additional contribution to image distortion. Control of the magnetic properties of this substrate material is also important to insure imaging quality.

OBJECTS OF THE INVENTION

It is an object of the invention to reduce artifacts in images created with an open MR imaging system.

Another object of the present invention is to provide an MR imaging system which produces higher-quality images than conventional systems.

Another object of the present invention is to provide a pole face for an open MR imaging system exhibiting reduced eddy currents.

Another object of the present invention is to provide a pole face for an open MR imaging system exhibiting reduced residual magnetization.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

Figure 1:
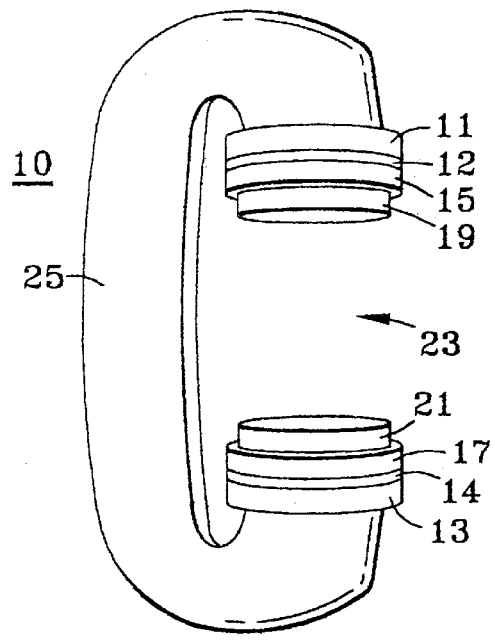
FIG. 1 is a schematic illustration of a portion of and 'open' magnetic resonance (MR) imaging system compatible with the present invention.

In FIG. 1 an 'open' magnet of a magnetic resonance (MR) imaging system 10 is shown. It includes magnetic excitation means 16, 18 having at least one excitation coil 22, 24 providing magnetic flux into adjacent pole pieces 11, 13. This magnetic flux passes into pole faces 15, 17. Excitation means 16, 18 creates a magnetic field which creates magnetic flux $B_0$ which flows through pole faces 15 and 17.

A set of gradient coils 19 and 21 produce a time-changing magnetic field B which, when combined with the static main field $B_0$, create a magnetic field gradient over an imaging volume 23.

Magnetic flux $B_0$, after passing through imaging volume 23, then may pass through a flux return structure 25 which connects the two sides of the open magnet.

Figure 2:
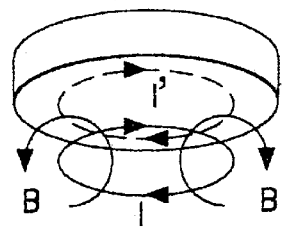
FIG. 2 is a perspective illustration of eddy currents induced in a prior art pole face.

In FIG. 2, an illustration is shown of pole face 15 and a gradient coil 19 having a current running I through it in the direction marked. By the right hand rule current I creates a magnetic flux B which passes through the center of the loop as shown in the figure. This magnetic flux thereby induces an eddy current I' as shown by the dotted line. Eddy current I' produces another magnetic field which opposes magnetic flux B'. This reduces the effect of magnetic field B and therefore causes disturbances in the imaging magnetic field and the magnetic field gradient. In a structure with finite electrical conductivity, the eddy currents redistribute and decay with time. This, therefore, causes artifacts in the image which depends upon a homogeneous magnetic field gradient. The larger the surface area, the longer the decay time by the square of the smallest dimension.

Figure 3:
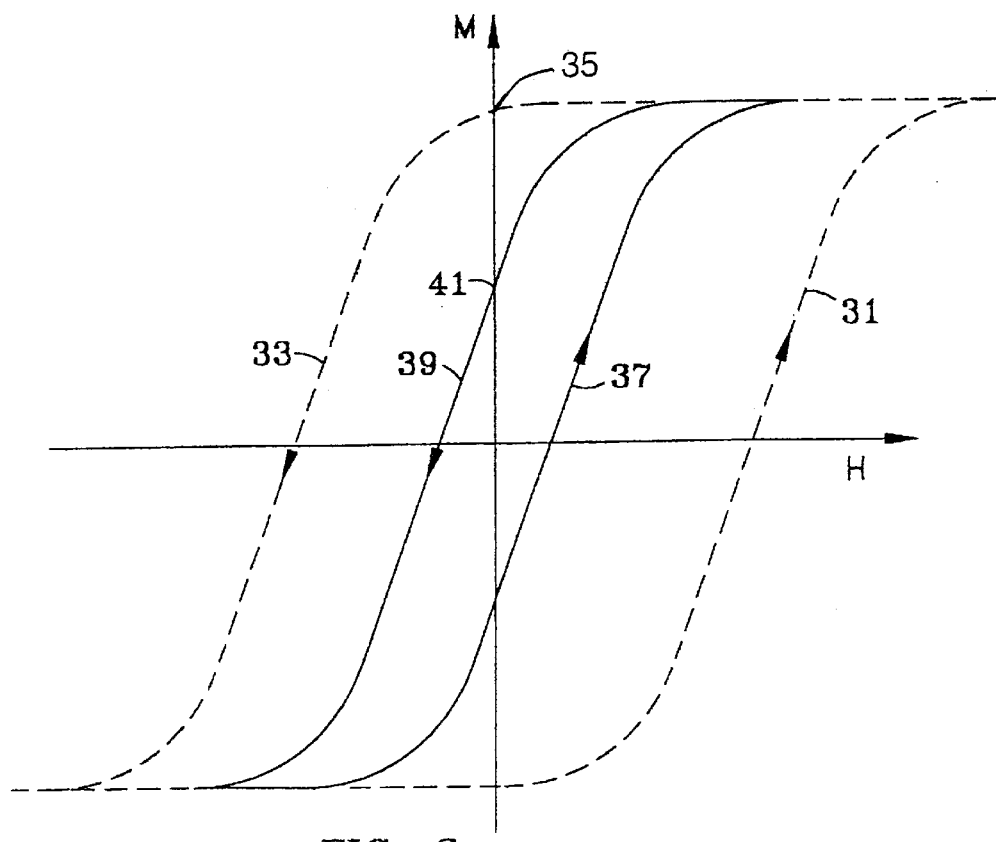
FIG. 3 is an graphical representation of hysteresis of various materials, exhibiting residual magnetization.

In FIG. 3 an illustration is shown of the hysteresis effects of various materials. When an magnetic field H acts upon a material, it causes some degree of magnetization M. When a material such as a permanent magnet is subjected to the applied magnetic field H, the resulting magnetism M is shown in a forward direction by path 31. When magnetic field H is applied in the opposite direction, magnetization M follows path 33. The degree of magnetization M of a material when it crosses the M axis is called the 'residual magnetization'. This material is marked by point 35.

Another magnetic material is shown by the trace 37, 39. Paths 37 and 39 exhibit a lower residual magnetization 41.

Relatively speaking, paths 31, 33 traces out a 'hard' magnetic material, as compared with paths 37, 39.

The residual magnetization is a result of coercive effects in the magnetic material. These coercive effects become very important with rapidly changing applied magnetic fields that also change in polarity. They also control the magnetization's relaxation to equilibrium when a field component is removed.

In any region of a ferromagnetic material the local magnetization is at it maximum or "saturated" value. These local regions where the magnetization is all parallel are called "domains". The thin dividing region between domains where the magnetization direction differs is called a "domain wall". The change in average magnetization as a result of applied field is due to the motion of these domain walls. The motion of these walls are impeded by defects in the material such as holes, inclusions, and the boundaries of small crystallites. The field required to move these walls is characterized by an equivalent "coercive" field usually represented by $H_c$. The wall impediment leads to hysteresis after a change of the magnetic field with the result that the "residual magnetization" state in which the average magnetization is left after a field change depends upon the initial magnetization and the time history of the magnetic field. The external magnetic field produced by this residual magnetization can perturb the imaging field in an MR imaging system from its desired value resulting in imaging artifacts.

The motion of these domain walls are also damped by the local eddy currents generated by the change in local magnetization as the wall moves. This leads to a delay in magnetization change when the field is turned on and to a relaxation in the magnetization when the drive field is removed. Both of these effects must be compensated to minimize image artifacts.

One of the main goals in open MR imaging, is to reduce the residual magnetization such that these gradients may be applied accurately and quickly.

Figure 4:
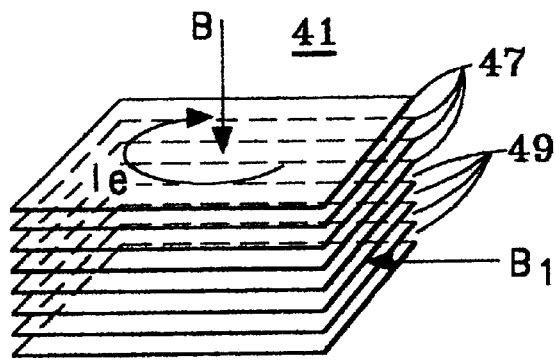
FIG. 4 illustrates the effect of the direction of magnetic flux on a laminate block.

FIG. 4 illustrates a laminate block 41 constructed from a stack of laminate sheets 47 each separated by, and held together with, a non-conductive substrate 49. This non-conductive substrate may be an epoxy, or other commonly used electrical insulator. The percentage of the block constructed of laminate sheets 47 relative to the total mass of the block 41, is referred to as a 'filing factor'. The filling factor may be adjusted, taking into account the dielectric constant of both sheet 47 material and substrate 49 material to design a block having a desired permeability. This may be described by the materials and the filling factor. Typically, using epoxy as substrate 49 and iron boron silicon (Fe—B—Si) for sheets 47, a filling factor of about 84% produces good results.

A magnetic field flux B is applied normal to sheets 47 of block 41. In this geometry, an eddy current $I_e$ is induced which flows as shown in the figure. The amount of induced current $I_e$ is near a maximum for this geometry.

However, if the magnetic flux $B_1$ is applied to block 41 in a direction parallel to laminate sheets 47, with each sheet 47 electrically isolated from the others by substrate material 49, there is very small path for an eddy current $I'_e$ to travel around flux $B_1$. Since the path through the eddy current is much smaller, the eddy current dissipation time, t, is much smaller. This means that the eddy currents $I_e$ diminish much more quickly than if applied in the direction of flux B.

If each of the sheets 47 of block 41 are constructed of a material which has very small, or no crystalline structure, there is less of a gross magnetic alignment effect as would be the case in a material which is comprised of large, random crystals. The small, random crystal orientation is referred to as amorphous.

Amorphous materials, due to their nature, reduce both the effect of eddy currents and that of residual magnetization.

The material employed should be an amorphous material and several which show excellent capability are iron boron silicon, Fe—B—Si, iron boron phosphorous, Fe—B—P, and iron phosphorous carbon (Fe—P—C). These may be considered amorphous since they have very small, or no crystalline structure and have very low coercive effects. Amorphous materials are also used since they may be used to easily construct very thin laminate sheets.

Amorphous materials also have other desirable properties. There electrical resistance is usually higher than closely related crystalline alloys thereby further dampening eddy currents.

The use of boron or phosphorous to obtain the amorphous metallic state often produces a thin insulating glass coating as a result of the oxidation of the surface during cast process. This oxidation acts as additional insulation between layers of laminate sheets.

The blocks 41 of the pole faces are designed such that they have an anisotropic response to magnetic flux in a direction parallel to the laminate sheets 47 and have a different magnetic flux response perpendicular to each of the laminate sheets 47. They have an anisotropic frequency response to magnetic flux in a direction parallel to the laminate sheets 47 and a magnetic flux perpendicular to each of the sheets of laminate sheets 47. This is done by creating laminate sheets having a skin thickness in material designed such that the overall or gross properties are consistent with desired ranges.

For example, the effective dielectric and the effective permeability are dependent upon not only the thickness of the laminate sheets 47, but the material of the laminate sheets 47 and the dielectric of the substrate material between the laminate sheets. This may be described in terms of the filling factor which is the percentage of laminate sheets relative to the total and the amount of substrate being the remainder of the percentage.

Typically, the laminate sheet thickness should be less than the 'skin depth'. A skin depth is determined by the maximum desired operating frequency associated with waveforms of the time-changing magnetic field gradients used in MR imaging. The skin depth is proportional to the square root of the frequency. For example, a skin depth may be 0.005 inches.

The maximum frequency is related to the shape and steepness of a desired magnetic field gradients applied. The highest Fourier frequency components which make up magnetic gradient waveforms determine the maximum frequency, and hence the skin depth. If corners of the waveform need not be very sharp, the maximum operating frequencies will be lower. The higher the frequency, the thinner the laminate sheets should be.

Typical MRI imaging frequencies would be on the order of 10 kHz. Typical materials used for the substrate may be an epoxy with a dielectric constant of 3.

Blocks 41 are then aligned such that the majority of the changing magnetic field flux is parallel to each of the sheets.

Figure 5:
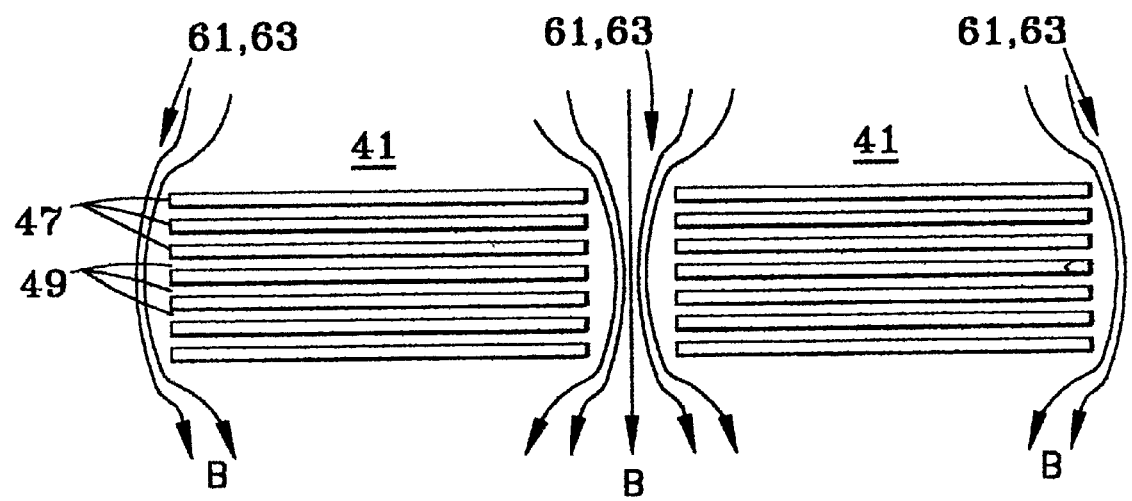
FIG. 5 illustrates magnetic flux around blocks according to the present invention.

Not only are the construction and materials of blocks 41 important, but also the size and spacing of the blocks become important in maximizing flux through the pole faces of the open magnet. In FIG. 5, two blocks 41 are shown adjacent to each other with spaces between them 61, 63. The smaller the blocks, the greater the reduction in eddy currents. However, smaller blocks result in a larger number of blocks with more gaps between them. Since air gaps have a larger reluctance that the blocks, there is larger reluctance to magnetic flux and a smaller permeability.

Therefore by choosing blocks having laminate sheets of the proper thickness and proper materials which are separated by a substrate of the proper thickness and material, an effective dielectric and permeability may be accomplished. By spacing these blocks apart from each other the proper amount, the maximum of flux may be obtained in a direction parallel to the laminate sheets 47. This effectively increases relative flux in a direction parallel to the sheets compared to flux normal to the sheets, thereby reducing eddy currents.

By partially overlapping the blocks in adjacent layers the relative amount of magnetic flux perpendicular and parallel to the layers. This is a method of optimizing performance between the magnetic source and the magnetic field gradients.

Typically imaging is done in the cylindrical coordinates with the Z axis coincident with the axis of the imaging magnet cylinder. Therefore the X and Y coordinates are merely the left, right and up-down directions and, for imaging purposes, may be the same. From these conditions, the size of each block should have a length, width (X, Y dimensions) which is less than a quarter wavelength of the maximum desired operating frequency. The same is true of the overall laminate sheet region when the dielectric constant and reluctance between blocks 41 is taken into account.

The materials chosen are also of a nature which reduces eddy currents and residual magnetization. There may be a tradeoff between selecting materials having further resistivity and exhibiting higher permeability since they may run opposite each other.

Figure 6:
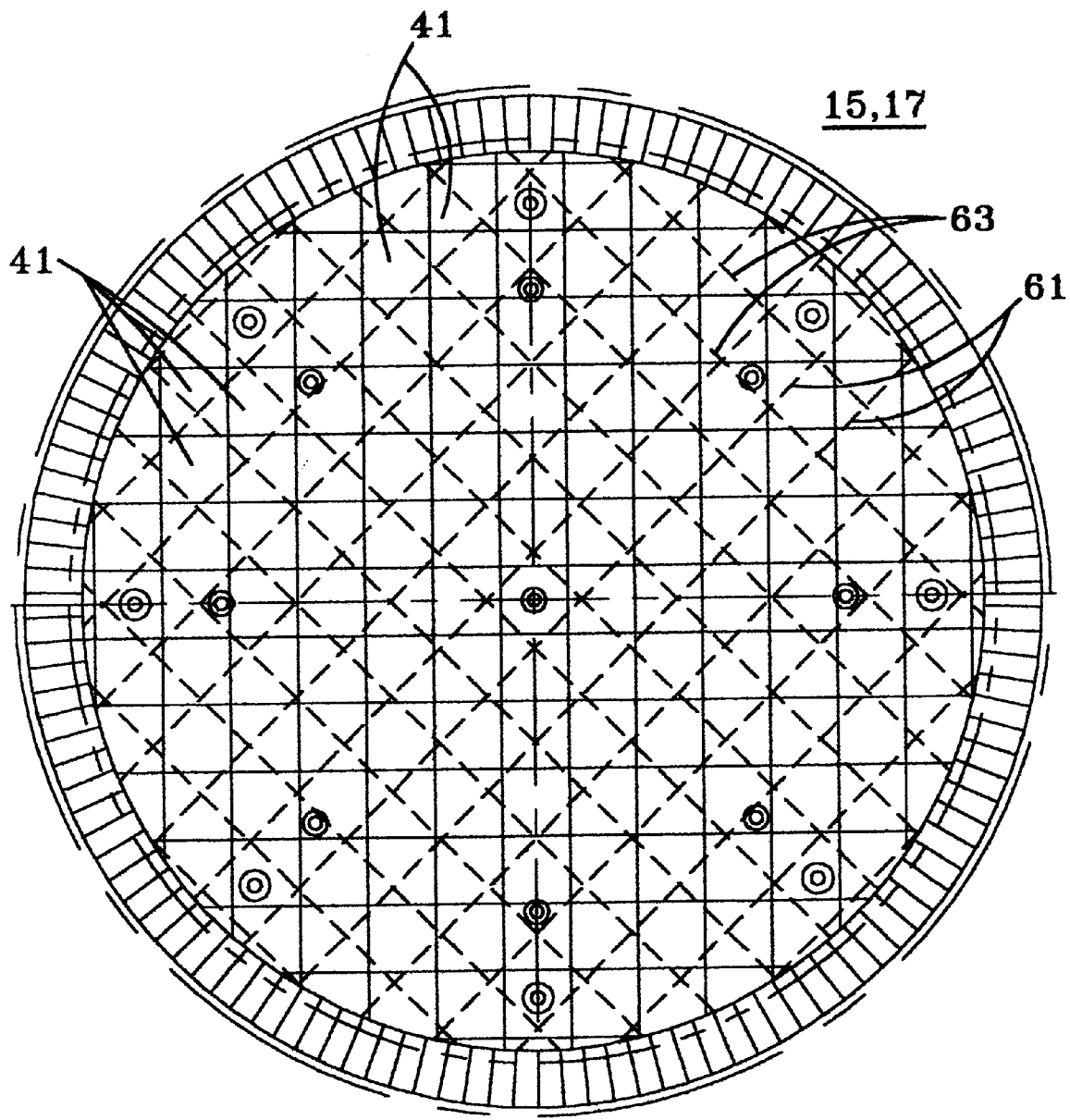
FIG. 6 is a plan view of one embodiment of a pole face constructed according to the present invention.

FIG. 6 shows a plan view of a pole face according to the present invention. Each of the blocks 41 is shown here as a square block, however, they may be rectangular or other shape. The spacing between the blocks 61 and 63 are important in creating the appropriate magnetic flux in directions both normal to the face of the block and along the direction of the block.

Figure 7:
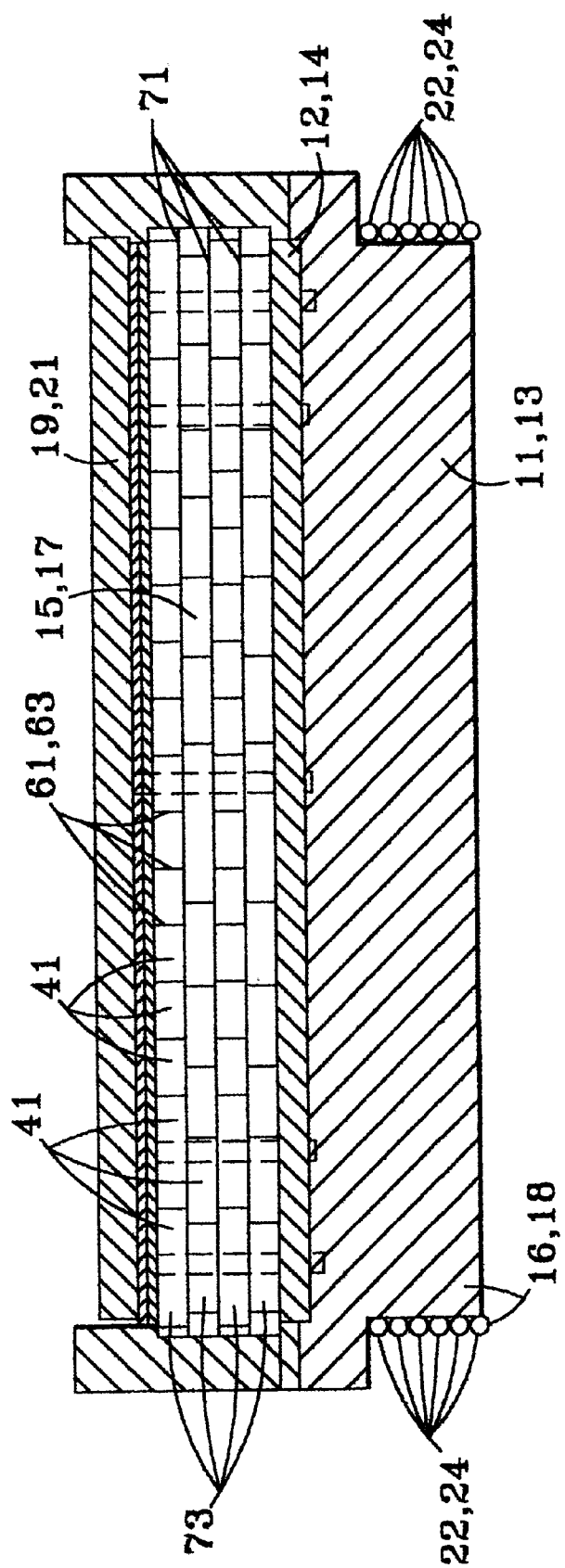
FIG. 7 is an elevational view of one embodiment of a pole face constructed according to the present invention.

FIG. 7 shows an elevational view shows an excitation means 16, 18 having excitation coils 22, 24 and pole piece 11, 13 which are adjacent to rows of blocks 41. Gradient coils 19, 21 are at a location closer to imaging volume 23 than pole faces 15, 17.

Spacing between blocks 61, 63 is shown here depending on the viewpoint of the pole face. Blocks 41 may be arranged in a plurality of layers 73. Spacing between layers 73 of blocks 41 also is important in creating a proper flux parallel to laminate sheets 47 of blocks 41.

In an alternative embodiment, there may be a flux shield 12, 14 between pole faces 15, 17 and pole pieces 1 1, 13 which has lower coercive forces than pole pieces 11, 13. This is preferably an annealed solid piece of silicon iron. The purpose of shield 12, 14 is to minimize the gradient flux (the time-changing magnetic field) from the MR gradient coils, from entering pole pieces 11, 13. This causes a biasing of the material in pole pieces 11, 13 to minimize the residual magnetization of pole pieces 11, 13. One common material is Vanadium Permendur™ manufactured by the Allegheny Ludlum Corporation of Brackenridge, Pa. Since it is desirable to have the same permeability for the X and Y directions, the block size and spacing in those directions typically are the same, as shown in FIGS. 6, 7, however, they may be different in some applications.

A major result of the present invention is to provide a pole face having a desired magnetic permeability in each direction by using a different filling factor, different laminate sheets 47 and substrate 49 materials, having different spaces 61, 63 between adjacent blocks 41, and spacing 71 between layers of blocks 41. This pole face may then preferentially direct the magnetic flux.

While several presently preferred embodiments of the novel MR imaging system have been described in detail herein, many modifications and variations will now become apparent to those skilled in the art. It is, therefore, to be understood that the appended claims are intended to cover all such modifications and variations as fall within the true spirit of the invention.

What is claimed is:

1. An 'open' magnetic resonance (MR) imaging system exhibiting reduced artifacts having at least pole pieces each having a substantially planar pole face opposite each other bounding an imaging volume, a magnetic excitation means having at least one excitation coil and pole pieces, the pole faces comprising:
   a plurality of magnetic blocks comprised of laminate sheets separated by, and held together with, a substrate, with each sheet aligned substantially parallel to the pole face, with each of the sheets comprised of an amorphous ferromagnetic material.

2. The 'open' MR imaging system of claim 1 wherein: the amorphous material is iron boron (Fe—B) to reduce residual magnetization.

3. The 'open' MR imaging system of claim 1 wherein: the amorphous material is iron boron silicon (Fe—B—Si) to reduce residual magnetization.

4. The 'open' MR imaging system of claim 1 wherein: the amorphous material is iron phosphorus (Fe—P) to reduce residual magnetization.

5. The 'open' MR imaging system of claim 1 wherein: the amorphous material is iron nickel boron (Fe—Ni—B) to reduce residual magnetization.

6. The 'open' MR imaging system of claim 1 wherein: the blocks in a specified direction have a spacing between adjacent blocks of a specified spacing selected to adjust the permeability of time-changing magnetic fields in the specified direction to between 100–500.

7. The 'open' MR imaging system of claim 1 wherein: there are a plurality of layers of blocks.

8. The 'open' MR imaging system of claim 7 wherein: the plurality of layers of blocks have a specified spacing selected as a tradeoff to adjust the permeability of time-changing magnetic fields in a direction through the layers such that these magnetic fields does not pass into the pole piece biasing the pole piece material.

9. The 'open' MR imaging system of claim 1 wherein: the blocks are constructed of laminate sheets having a thickness less than a 'skin depth'.

10. The 'open' MR imaging system of claim 1 wherein: the blocks have a filling factor of approximately 80–95%.

11. The 'open' MR imaging system of claim 1 wherein blocks have a length, width minimized to reduce eddy currents.

12. A magnetic flux conduit for receiving magnetic flux from a pole piece and for preferentially directing magnetic flux in each of an X, Y and Z direction, comprising:
    a pole face comprised of a plurality of layers, each layer comprising blocks of laminate sheets spaced from each other in each of the X and Y directions to match a predefined magnetic permeability in that direction.

13. The magnetic flux conduit of claim 12 wherein the blocks comprise laminate sheets separated by a substrate with a wherein the filling factor, laminate sheet and substrate materials are selected to match a predefined permeability both along the direction of the laminate sheets and perpendicular to the laminate sheets.

14. The magnetic flux conduit of claim 12 wherein the spacing between layers is selected to match a predefined permeability in the Z direction.

15. The magnetic flux conduit of claim 12 further comprising:
    a flux shield comprised of a solid piece of material between the pole piece and the pole faces operating to reduce magnetic flux from other sources from entering the pole piece thereby reducing the residual magnetization of the pole piece.

16. The magnetic flux conduit of claim 15 wherein the flux shield is comprised of annealed silicon iron.

17. The magnetic flux conduit of claim 15 wherein the blocks in adjacent layers are partially overlapped to control the relative amount of gradient magnetic flux perpendicular and parallel to the layers.

18. The magnetic flux conduit of claim 12 wherein the blocks in adjacent layers are partially overlapped to control the relative amount of source magnetic flux perpendicular and parallel to the layers.

* * * * *